United States Patent [19]

Heeger et al.

[11] Patent Number: 5,504,323
[45] Date of Patent: Apr. 2, 1996

[54] DUAL FUNCTION CONDUCTING POLYMER DIODES

[75] Inventors: Alan J. Heeger, Santa Barbara; Gang Yu, Goleta, both of Calif.

[73] Assignee: The Regents of the University of California, Oakland, Calif.

[21] Appl. No.: 163,174

[22] Filed: Dec. 7, 1993

[51] Int. Cl.$^6$ .................................................. H01J 40/14
[52] U.S. Cl. ........................ 250/214.1; 257/103; 257/85
[58] Field of Search ........................ 250/214.1, 214 RC, 250/214 R, 214 LS, 214 SG; 257/103, 82, 482, 496, 40, 84, 85

[56] References Cited

U.S. PATENT DOCUMENTS 5,142,343  8/1992  Hosokawa et al. ............... 257/103
5,247,190  9/1993  Friend et al. ...................... 257/103

OTHER PUBLICATIONS

Tomozawa et al., "Metal-polymer schottky barriers on processible polymers" *Synthetic Metals* 28:C687–C690, Jan. 1989.
Braun et al., "Visible light emission for semiconducting polymer diodes" *Applied Physics Letters* 58(18):1982–1984, Feb. 1991.
Burroughes et al., "Light-emitting diodes based on conjugated polymers" *Nature* 347:539–541, Oct. 1990.
Gustafsson et al., "Flexible light-emitting diodes made from soluble conducting polymers" *Nature* 357:477–478, Jun. 1992.
Zhang et al., "Yellow electroluminescent diodes utilizing poly(2,5–bis(cholestanoxy)–1,4–phenylene vinylene)" *Journal of Electronic Materials* 22(4):413–417, Feb. 1993.
Friend, R., "LED's based on conjugated polymers—progress and prospects" Oral Presentation from the *Mini-symposium on Polymer Light–Emitting Diodes from Molecule to Device*, Eindhoven, Sep. 15–17, 1993.
Karg et al., "Electrical and optical characterization of poly(phenylene–vinylene) light emitting diodes" *Synthetic Metals* 54:427–433, Jan. 1993.
McGraw–Hill *Encyclopedia of Science and Technology* 6th Edition, McGraw–Hill Book Company, New York, vol. 13, p. 379, Jan. 1987.
Braun et al., "Nanosecond transient electroluminescence from polymer light–emitting diodes" *Applied Physics Letters* 61(26):3092–3094, Oct. 1992.
Antoniadis et al., "Generation and drift of photocarriers in a conjugated ladder polymer" *Synthetic Metals* 60:149–157, Apr. 1993.

*Primary Examiner*—David C. Nelms
*Assistant Examiner*—Que T. Le
*Attorney, Agent, or Firm*—Morrison & Foerster

[57] ABSTRACT

Dual function diodes based on conjugated organic polymer active layers are disclosed. When positively biased the diodes function as light emitters. When negatively biased they are highly efficient photodiodes. Methods of preparation and use of these diodes in displays and input/output devices are also disclosed.

29 Claims, 6 Drawing Sheets

DUAL FUNCTION CONDUCTING POLYMER DIODES

This invention was made with Government support under Grant No. 93ER12138, awarded by the Department of Energy. The Government has certain rights to this invention.

BACKGROUND OF THE INVENTION

1. Field of the Invention

This invention concerns diodes and their use and fabrication. More particularly, it concerns diodes which include semiconducting conjugated polymers. These diodes have both light-emission and photo-detection properties and may be used in displays and the like.

2. Brief Description of the Prior Art

Solid-state light-emitting diodes ("LEDs") have found widespread application. Conventional LEDs are fabricated for inorganic semiconductors such as gallium arsenide typically doped with aluminum, indium or phosphorus.

Since about 1989, interest has been drawn to LEDs fabricated from semiconducting organic polymers. In 1989, coinventor A. J. Heeger and others described diodes formed from polymers (H. Tomozawa, D. Braun, S. D. Phillips, R. Worland, A. J. Heeger and H. Kroemer, *Synth. Met.* 28, C687 (1989)) and in a latter paper (D. Braun and A. J. Heeger *Appl. Phys. Lett.* 58, 1982 (1991) pointed out that these diodes emitted light. In 1990, others (H. Burroughs, D. D. C. Bradley, A. R. Brown, R. N. Marks, K. Mackay, R. H. Friend, P. L. Burns and A. B. Holms, *Nature* 347, 539) described a light-emitting diode based on conducting organic polymers.

These conductive polymer-based materials offer promise because they present superior fabrication possibilities coupled with reasonable conversion efficiency. Using indium/tin oxide ("ITO") and the semiconducting polymer, poly(2-methoxy-5-(2'-ethylhexyloxy)-1,4-phenylene vinylene), ("MEH-PPV") in a Ca/MEH-PPV/ITO layered thin film device, D. Braun and A. J. Heeger (*Appl. Phys. Lett.*) demonstrated light emission at an external energy conversion of 1% (photons/electrons).

By using a conducting polymer, rather than indium/tin-oxide, as the hole-injecting contact, robust and mechanically flexible LEDs have been demonstrated (G. Gustafsson, Y. Cao, G. M. Treacy, F. Klavetter, N. Colaneri, and A. J. Heeger, *Nature* 337, 477 (1992)). Recent work has shown that by generalizing to heterojunction devices which include an electron transport layer, device efficiency can be improved in polymer LEDs using BCHA-PPV (C. Zhang, S. Höger, K. Pakbaz, F. Wudl and A. J. Heeger, *J. Electron. Mater.* 22, 745 (1993)) and in polymer LEDS using poly(phenylene vinylene), ("PPV"), with air-stable electrodes for example, aluminum and indium. (R. Friend, Oral presentation at the Minisymposium on Polymer Light Emitting Diodes, Eindhoven, Sep. 15–17, 1993)

It has recently been reported by several groups that diodes fabricated from poly(phenylene vinylene) give a photovoltaic response. (S. Karg, W. Riess, V. Dyakonov and M. Schwoerer, *Synth. Met.* 54, 427 (1993); H. Antoniadis, B. R. Hsieh, M. A. Abkowitz, S. A. Jenekhe and M. Stolka, *Synth. Met.* (in press)) This is consistent with experience with inorganic semiconductors which are typically "light sensitive to some degree." McGraw-Hill *Encyclopedia of Science and Technology* 13, 379 "Photodiode," 1987.

STATEMENT OF THE INVENTION

It has now been found that the photosensitivity of organic polymer-based diodes can be remarkably increased by applying a reverse bias to the electrode. When a −10 V bias is applied across a semiconductive organic polymer-based diode, the dc sensitivity can be increased to typically about $9 \times 10^{-2}$ A/watt at an illumination of 1 μW/cm². This corresponds to a quantum yield of more than 20% on an electron/photon basis.

This discovery that applying reverse bias can increase the photosensitivity of organic polymer-containing diodes can be embodied as a light-responsive diode system. This system includes such a diode in combination with a source of a reverse-biasing voltage, a light source capable of impinging upon the diode, and a detector for detecting a current flow and/or a voltage produced by the diode as a result of the reverse biasing and the impinging of light upon the diode. The diode includes three elements which are named using LED nomenclature. The first is a layer of high work function material, the second is an active layer of semiconducting luminescent conjugated polymer in contact with the first layer, and the third is a conductive metal layer preferably made up of or including at least one low work function material.

As will be noted by comparing this diode structure with that set forth in the Braun and Heeger article noted above, the diode structure just recited can function as a light-emitting diode when a forward bias is applied. The exponential increase of the photocurrent under reverse bias is surprising and unexpected based on known models for conventional inorganic diode operation and leads to a second aspect of this invention which is a dual function polymer diode. In one function, under the influence of a forward bias, the above-described diode acts as a light-emitting diode. In the other function, under the influence of a negative bias, the diode acts as a light-detecting photodiode.

These diodes can be isolated devices or a plurality of them can be assembled into an array, which array can have the dual function of the individual diodes.

The dual function capability of the polymer diodes and arrays of such polymer diodes makes possible a variety of applications for this invention. By integrating the two functions of the polymer diode, electroluminescence and photo-detection response, in the same diode or in an array of diodes, one can achieve a display capable of performing a dual function Function 1: Input (by addressing or "writing" with a light stylus on the diode or the array).

Function 2: Output (by electroluminescently displaying using the diode or the array).

This dual function capability, in combination with other known advantages which characterize diodes made with semiconducting (conjugated) polymers, ease of fabrication into large areas and desired shapes on rigid or flexible substrates, offers promise for novel displays fabricated with pixels employing such polymer-based diodes.

Thus, in an additional aspect, the present invention provides arrays of dual function diodes, said diode arrays consisting of individual pixels which are both light-emitting diodes and photo-detecting photodiodes, fabricated using semiconducting polymers as the active layer.

In yet an additional aspect, the present invention utilizes the processing advantages associated with the fabrication of said dual function polymer diode structures from soluble semiconducting (conjugated) polymers (and/or their precursor polymers), cast from solution to enable the fabrication of large active areas.

DETAILED DESCRIPTION OF THE INVENTION

BRIEF DESCRIPTION OF THE DRAWINGS

This invention will be further described with reference being made to the drawings in which.

DESCRIPTION OF PREFERRED EMBODIMENTS

Definitions

Figure 1:
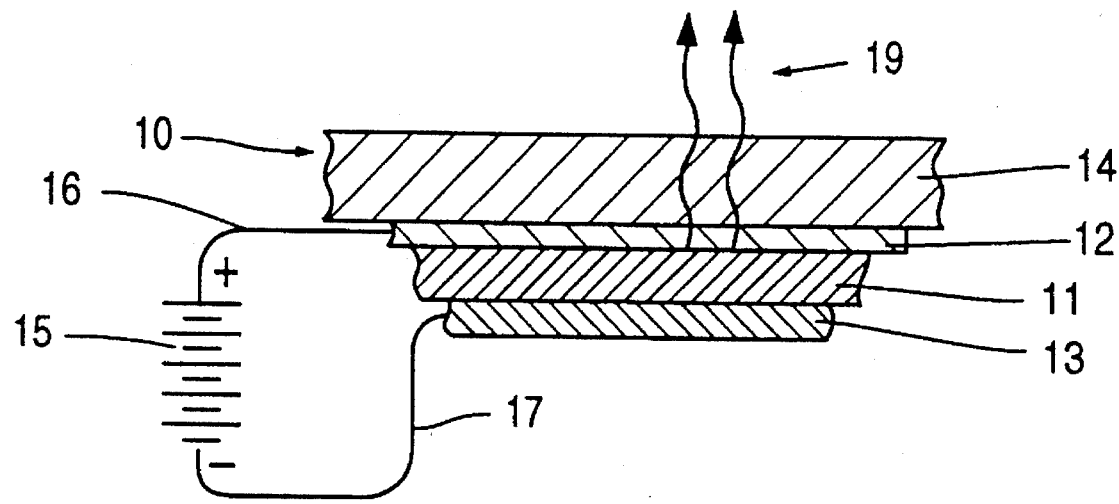
FIG. 1 is a cross-sectional view of a diode of this invention assembled into a circuit so as to function in its forward biased or "light emitting" mode.

In this description of preferred embodiments and the claims reference will be made to several terms which should be defined. One group of terms concerns the structure of the diodes themselves. As shown in devices 10 and 20 in FIGS. 1 and 2, the diodes are multilayer devices. These layers are referred to by the names typically used in light emitting diode descriptions. That is, they include:

- an "active layer" (layer 11) which is made up of the semiconducting luminescent conjugated organic polymer;
- a "hole-injecting layer" or "first layer" (layer 12) which, in a LED, functions as the positive electrode; and
- an "electron injecting layer", "rectifying contact" or "third layer" (layer 13) which serves as the negative contact in an LED.

The "hole injecting layer" is formed of a material having a "high work function." A "high work function" is one above 4.5 eV.

The "electron injecting layer" is a conductive layer, typically a conductive metal layer, preferably formed of a material having a "low work function." A "low work function" is one below 4.3 eV.

Figure 2:
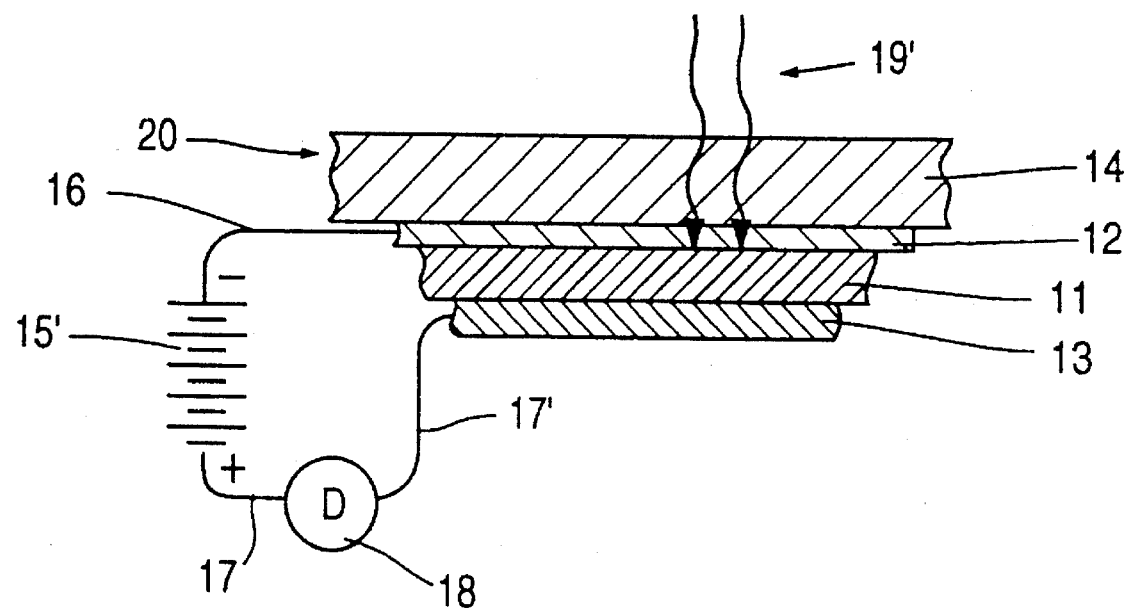
FIG. 2 is a cross-sectional view of the same diode as shown in FIG. 1 this time assembled into a circuit so as to function in its reverse biased or "photodetector" mode.

As shown in FIGS. 1 and 2, the devices may also include an optional substrate or support 14. This is a solid, rigid or flexible layer designed to provide robustness to the diodes.

The devices of this invention emit "light" under certain circumstances and provide an electrical response to "light" in other circumstances. "Light" is defined broadly so as to include wavelengths beyond the visible range of 400–800 nm, that is so as to include ultraviolet of 200–400 nm and infrared of 800–2000 nm wavelengths. There is no requirement that a device should emit and respond to exactly the same wavelengths of light. This can offer attractive applications where the diode can serve as an "optical transformer" converting detected light of one wavelength into emitted light of another wavelength in the same pixel or element.

A device can be said to "emit" light when the quantity of light which it produces can be detected by the human eye or by an instrument.

Several layers are described as "transparent." This term is used to refer to the property of a material of transmitting a substantial portion (i.e., at least 38%, and preferably at least about 50%) of a given wavelength of light impinging upon it.

A "conductive" layer or material has a conductivity of at least 1 S/cm. A "semiconductive" material has a conductivity of from 10$^{-12}$ S/cm to 10$^{-4}$ S/cm.

When referring to values for negative voltage, as in the case of the reverse biasing voltages applied to obtain enhanced photosensitivity, the relative size of values will be set in absolute value terms, such that a −10 volt voltage is "larger" or "greater than" a −5 volt voltage.

Device Structures

In the most common structure, as shown in FIGS. 1 and 2, the device 10 or 20 of this invention comprises a conductive metal contact 13, preferably fabricated of low work function metal on one side of a semiconductive conjugated polymer film 11. A third layer, (high work function) electrode 12 is on the other side of the polymer film. This electrode 11 is commonly transparent so that light 19 can pass to and from the active layer 11 as shown in FIGS. 1 and 2. Thus, these three layers can make up the device but more commonly a transparent substrate 14 is present adjacent to electrode 12.

Devices with inverted geometry are also useful. For example, by using an inorganic semiconductor such as silicon as the substrate 14 and by heavily doping this semiconductor to "conductive" metallic levels (as that term is defined herein), the heavily doped semiconductor can serve both as the substrate and as the contact 13. In this inverted configuration, the active polymer layer 11 is applied next, and the transparent high work function electrode 12 is applied as the top layer. Such inverted devices on inorganic semiconductor substrates offer the advantage of integrating the optical functions (light emission and light detection) with circuitry that can be built directly onto the inorganic semiconductor substrate.

Arrays of such dual-function polymer diodes can be fabricated by standard methods utilizing masks, lithography, silk-screening etc to achieve the necessary patterning. These methods are well known to those knowledgeable of the art of display technology.

The Active Layer

The active layer in the diodes is semiconductive, It employs one or more conjugated luminescent polymers as its conductive element. The active layer can be composed essentially completely of one or more conjugated polymers. The active layer can be a blend of one or more conjugated polymers in hole-transporting or electron-transporting polymers. The active layer can also be presented as a series of heterojunctions utilizing layers of semiconductive luminescent conjugated polymers as donors and organic polymeric acceptors having electronegativity in a range which will enable a photoinitiated charge separation process defined by the following steps:

Step 1: $D+A \rightarrow {}^{1,3}D^*+A$, (excitation on D);

Step 2: ${}^{1,3}D^*+A \rightarrow {}^{1,3}(D\text{---}A)^*$, (excitation delocalized on D-A complex);

Step 3: ${}^{1,3}(D\text{---}A)^* \rightarrow {}^{1,3}(D^{\delta+}\text{---}A^{\delta-})^*$, (charge transfer initiated);

Step 4: ${}^{1,3}(D^{\delta+}\text{---}A^{\delta-})^* \rightarrow {}^{1,3}(D^{+\bullet}\text{---}A^{-\bullet})$, (ion radical pair formed);

Step 5: ${}^{1,3}(D^{+\bullet}\text{---}A^{-\bullet}) \rightarrow D^{+\bullet}+A^{-\bullet}$, (charge separation)

where (D) denotes the donor semiconducting luminescent polymer and (A) denotes the accompanying organic polymeric acceptor; 1,3 denotes singlet or triplet excited states, respectively. The heterojunction active layers are described more fully in U.S. patent application Ser. No. 07/930,161 which is incorporated herein.

The other layers used herein preferably include at least one of the conjugated conductive polymers known in the art generally. Preferably, the conjugated polymers are soluble enough in some common solvent to form a casting solution so as to facilitate fabrication of the active layer in the device by casting or a like fluid phase process.

Examples of typical conjugated polymers include polyacetylne; polypyrrole; polyisothianaphene; poly(paraphenylene); poly(phenylenevinylene) or "PPV"; alkoxy derivatives of PPV, containing up to three, 1 to 10 carbon atoms long, alkoxys per PPV unit, and especially one to two, 1 to 8 carbon atoms long, alkoxys per PPV unit. Such materials include, for example, poly(2-methoxy,5-(2'ethylhexyloxy)-p-phenylenevinylene) ("MEH-PPV"), poly(2,5-dimethoxy-p-phenylenevinylene) ("PDMPV"), and poly(2,5-bis(c-holestanoxy)-1,4-phenylenevinylene) ("BCHA-PPV") (see U.S. patent application Ser. No. 07/800,555, incorporated herein); polythiophene and poly(3-alkylthiophenes) ("P3AT's"") wherein the alkyls are from 6 to 16 carbons; poly(2,5-thienylenevinylene); polycarbazone; poly(1,6-heptadiyne); polyquinoline and polyanilines ("PANI"). Representative PANI materials are described in U.S. Pat. No. 5,196,144 which is incorporated by reference. The MEH-PPV materials give good results and are presently preferred.

In some embodiments, the conjugated polymer is present in admixture with one or more carrier polymers. Carrier polymers may be added for cost savings or to improve durability or processibility.

Carrier polymers are typically selected on the basis of compatibility of the conjugated polymer as well as with the solvent or solvents used in solvent processing, if that forming method is used. For example, blending of polar conducting polymers generally requires polar carrier polymers that are capable of co-dissolving with or absorbing polar materials. Examples of polar carrier polymers include poly (vinyl alcohol), poly(ethylene oxide), poly(paraphenylene terephthalate), poly(ethylene terephthalate), poly(parabenzamide), and the like. On the other hand, if blending of the conductive polymer cannot proceed in a polar environment, nonpolar carrier polymers are typically selected. These include the common nonpolar polymers, such as polystyrene, polyolefins including polyethylene, polypropylene, and polybutadiene, and the like. Most commonly, high molecular weight (MW>100,000) flexible chain polymers are preferred. However, lower molecular weight materials may be employed as well.

The carrier polymer is optional. The upper limit on carrier polymer proportions is dictated by the desire to not seriously interfere with the conductivity imparted by the conjugated polymer to the active layer. Thus, the proportion of carrier polymer can range from 0 to about 90% of the total polymer in the active layer with proportions of 0 to 66% and especially 0 to 33% being preferred.

Typical active layer film thicknesses range from a few hundred Angstrom units to a few thousand Angstrom units, i.e. 300 Å to 4000 Å (1 Angstrom unit=$10^{-8}$ cm). Although the active film thicknesses are not critical, device performance can typically be improved by using thinner films rather than thicker films. For the dual function devices, which require optical input, the film thickness optimally should be adjusted to an optical density such that light, such as visible light, is absorbed throughout the film thickness. Thicknesses from 600 Å to 2000 Å have been used in the experiments reported here.

The High work Function First Layer

The conjugated polymer active layer of the diodes of this invention is bounded on one surface by a conducting first layer. This layer serves as a hole injector. When a substrate is present, this layer is typically between the substrate and the conjugated polymer layer. This first layer is a conductive layer made of a high work function material. This layer can be a film of an electronegative metal such as gold or silver, with gold being the preferred member of that group. It can also be formed of a conductive metal-metal oxide mixture such as indium-tin oxide (ITO).

This layer can also be formed of a conductive polymer such as polyaniline (PANI) in the emeraldine salt form prepared using the counterion-induced processability technology disclosed in U.S. Pat. No. 5,232,631 and in *Applied Phys. Lett.* 60:2711 (1992) or other suitable techniques. In addition, combinations of these layers may be used, for example a stock of alternating PANI and ITO layers. This first layer should be conductive as evidenced by a sheet resistance of less than 300 ohms/square and preferably of less than 100 ohms/square.

It should be kept in mind that in most embodiments, light is either emitted through this layer or impinges upon the active layer through this layer. This means that in these cases the first layer should be transparent. In the case of metal (e.g., gold or silver) this calls for ultra thin layers such as below about 200 Å and especially from about 25 to about 100 Å. In the case of the metal oxides and the conjugated polymer material, there is better transparency and thickness of up to about 2000 Å, and especially 50 to 100 Å, can be employed.

These layers are commonly deposited by vacuum sputtering, (RF or magnetron) electron beam evaporation, thermal vapor deposition, chemical deposition and the like.

The Low Work Function "Third Layer" Contact

An electron-injecting contact is present on the other side of the conjugated polymer film. This layer is fabricated from a conductive metal or metal alloy and preferably a low work function metal or alloy. Typical materials include aluminum, indium, calcium, barium and magnesium, with calcium being a particularly good material. As previously noted, in the "inverted" structure, this contact can be a layer of conjugated polymer doped to metallic levels such as with one or more of the low work function metals just described. These electrodes are applied by using methods well known to the art (e.g. vacuum evaporated, sputtered, or electron-beam evaporated) and act as the rectifying contact in the diode structure. These electrodes are from about 100 to about 20,000 Å thick with preferred thicknesses being from 500 to about 10,000 Å and especially 100 to 500 Å.

The Substrate

In some embodiments, the conjugated polymer-based LEDs are prepared on a substrate. The substrate should be nonconducting. It can be a rigid material such as a rigid plastic including rigid acrylates, carbonates, and the like, rigid inorganic oxides such as glass, quartz, sapphire, and the like. It can also be a flexible or rigid organic polymer such as polyester—for example poly(ethylene terephthalate), flexible polycarbonate, poly(methylmethacrylate), polystyrene and the like.

The thickness of this substrate is not critical so long as it accomplishes its supporting function. Thicknesses of a few microns to a millimeter or more may be used.

In the usual structures for these diodes, the light impinging upon or emitted from the diode passes through the substrate. In these cases the substrate should be transparent.

Methods of Preparation

A key advantage offered by the present organic polymer-based diodes is the variety of processing methods which can be used to form them.

In the more typical case of a substrated material, the diode is usually built up by adding layers serially. This normally takes the form of depositing the "first" layer on the substrate, followed by the active layer, followed by the low work function third layer.

As previously noted the first layer can be laid down using any of the known thin-film forming processes, including evaporation, sputtering or the like. If a conjugated polymer first layer is employed, it may be put down by casting from a solution or suspension.

The conjugated polymer active layer can be deposited or cast directly from solution or suspension. The solvent employed is one which will dissolve or disperse the conjugated polymer and optional carrier polymer and not interfere with their subsequent deposition.

Typically, Organic solvents are used. These can include halohydrocarbons such as methylene chloride, chloroform, and carbon tetrachloride; aromatic hydrocarbons such as xylene, benzene, and toluene; other hydrocarbons such as decaline, and the like. Mixed solvents can be used, as well. Polar solvents such as water, acetone, acids and the like may be suitable. These are merely a representative exemplification and the solvent can be selected broadly from materials meeting the criteria set forth above.

When depositing the conjugated polymer active layer, the casting solution can be relatively dilute, such as from 0.1 to 20% w in concentration, especially 0.2 to 5% w. More concentrated materials can be used but may prove less desirable when forming the thin layers called for.

In those embodiments where no substrate is present, the first layer and high work function layer can be deposited upon a preformed active layer or the first layer and active layer can be formed upon a preformed second layer.

Applications of the Invention

The diodes of this invention are bifunctional. They exhibit light 19 emission properties when driven with a forward bias as shown in FIG. 1. In FIG. 1, power source 15 delivers a positive voltage to first layer 12 via line 16 and the circuit is completed by line 17 connected from the power source 15 to layer 13. Typical emission turn-on voltages are plus 1.5 to 2 volts in many cases and with voltages from plus 1.5 to 10 volts being most useful.

Conversely, when driven with a negative bias, as shown in FIG. 2, they exhibit photovoltaic properties in response to light 19'. In FIG. 2, power source 15' delivers a negative voltage to layer 12. The photocurrent is measured as a voltage drop on the load 18. As a general rule, the photosensitivity increases with reverse voltage at least to $-10$ or $-15$ volts. The reverse voltage can go to larger negative values as well. Preferred reverse bias values range from about $-1.5$ volts to about $-20$ volts and particularly from about $-2.5$ to about $-15$ volts. It will be noted that the figures presented herein show that a seemingly voltage and light-dependent current flow begins about immediately below the about plus 1.5 volt emission turn-on value. This suggests that in fact, it is possible to obtain a useful photovoltaic output at very low positive voltages (i.e., in the 0 to 1.5 volt range). In view of the increased sensitivity at negative bias, this mode of operation is preferred.

We have found that when operating Ca/MEH-PPV/ITO devices as photodiodes, the photoresponse increases significantly under reverse bias. For example, at $-10$ V bias, the dc sensitivity is $9\times10^{-2}$ A/watt under illumination of 1 $\mu$W/cm$^2$, corresponding to a quantum yield of more than 20% electrons/photon. The same devices exhibit electroluminescence under forward bias. Electroluminescence becomes detectable in forward bias for voltages greater than 2.0 volts and visible under room light for currents larger than $10^{-3}$ A/cm$^2$. The emitted light is proportional to the forward current with external quantum efficiency of approximately 1% photons/electron for voltages above about 2.5 volts.

Specific advantages of this invention over the prior art include the following:

(i) Integrating the two functions, electroluminescence and photo-response, in the same device offers special opportunities: the polymer diode is a dual-function device capable of being used in display technology for both input (for example, addressing or "writing" with a light stylus) and output (as an electroluminescent display).

(ii) This dual-function capability in combination with other known advantages which characterize devices made with soluble conjugated polymers (ease of fabrication into large areas and desired shapes on rigid or flexible substrates), offers promise for novel displays fabricated with pixels made of such polymer devices.

Accordingly, the present invention finds application as dual-function diodes, said diodes being both light-emitting diodes and photo-detecting diodes, fabricated using semiconducting polymers as the active semiconducting layer.

The present invention also provides arrays of dual-function diodes, said diode arrays consisting of individual pixels which are both light-emitting diodes and photo-detecting photodiodes, fabricated using semiconducting polymers as the active layer.

The present invention also permits one to utilize the processing advantages associated with the fabrication of dual function polymer diode structures from soluble semiconducting (conjugated) polymers (and/or their precursor polymers), cast from solution to enable the fabrication of large active areas.

It is additionally possible with the present invention to provide dual function diodes and diode arrays fabricated using semiconducting polymers for use in display technology for input (by addressing or "writing" with a light stylus) where the output might be a separate display such as, for example, a liquid crystal display (LCD).

EXAMPLES

This invention will be further described with reference to the accompanying Examples. These are presented to illustrate ways of practicing the invention but are not to be construed as limiting its scope.

These examples are preceded by a section in which a semiconducting conjugated polymer used in the active layers in the Examples, "MEH-PPV," is prepared.

Preparation of poly(2-methoxy,5-(2'-ethyl hexyloxy)-p-phenylenevinylene) "MEH-PPV"

1. Monomer Synthesis

A. Preparation of 1-Methoxy-4-(2-Ethyl-Hexyloxy)Benzene (1)

A solution of 24.8 g (0.2 mole) of 4-methoxy phenol in 150 ml dry methanol was mixed under nitrogen with 2.5M solution of sodium methoxide (1.1 equivalent) and refluxed for 20 min. After cooling the reaction mixture to room temperature, a solution of 2-ethylbromohexane (42.5 ml, 1.1 equivalent) in 150 ml methanol was added dropwise. After refluxing for 16 h, the brownish solution turned light yellow. The methanol was evaporated and the remaining mixture of the white solid and yellow oil was combined with 200 ml of ether, washed several times with 10% aqueous sodium hydroxide, $H_2O$ and dried over $MgSO_4$. After the solvent was evaporated, 40 g (85%) of yellow oil was obtained. The crude material was distilled under vacuum (2.2 mm Hg, b.p. 148°–149° C.), to give a clear, viscous liquid. $^1H$ NMR ($CDCl_3$) δ6.98 (4H, s, aromatics), 3.8 (5H, t, O-$CH_2$, O-$CH_3$), 0.7–1.7 (15 H, m, $C_7H_{15}$. IR (NaCl plate) 750, 790, 825, 925, 1045, 1105, 1180, 1235, 1290, 1385, 1445, 1470, 1510, 1595, 1615, 1850, 2030, 2870, 2920, 2960, 3040. MS. Anal. Calc. for $C_{15}H_{24}O_2$: C, 76.23; H, 10.23; O, 13.54. Found: C, 76.38; H, 10.21; O, 13.45.

B. Preparation of 2,5-bis(Chloromethyl)-1-Methoxy-4-(2-Ethyl-Hexyloxy)Benzene

To the solution of 4.9 g (20.7 mmoles) of compound (1) in 100 ml p-dioxane cooled down to 0°–5° C., 18 ml of conc. HCl, and 10 ml of 37% aqueous formalin solution was added. Anhydrous HCl was bubbled for 30 min, the reaction mixture warmed up to R.T. and stirred for 1.5–2 h. Another 10 ml of formalin solution was added and HCl gas bubbled for 5–10 min at 0°–5° C. After stirring at R.T. for 16 h, and then refluxed for 3–4 h. After cooling and removing the solvents, an off-white "greasy" solid was obtained. The material was dissolved in a minimum amount of hexane and precipitated by adding methanol until the solution became cloudy. After cooling, filtering and washing with cold methanol, 3.4 g (52%) of white crystalline material (mp 52°–54° C.) was obtained. $^1H$ NMR ($CDCl_3$) δ6.98 (2H, s, aromatics), 4.65 (4H, s, $CH_2$-Cl, 3.86 (5H, t, O-$CH_3$, O-$CH_2$), 0.9–1.5 (15H, m, $C_7H_{15}$), IR (KBr) 610, 700, 740, 875, 915, 1045, 1140, 1185, 1230, 1265, 1320, 1420, 1470, 1520, 1620, 1730, 2880, 2930, 2960, 3050. MS. Anal. Calc. for $C_{17}H_{26}O_2Cl_2$: C, 61.26; H, 7.86; O, 9.60; Cl, 21.27. Found: C, 61.31; h, 7.74; O, 9.72; Cl, 21.39.

2. Polymerization

To a solution of 1.0 g (3 mmol) of 2,5-bis(chloromethyl)-methoxy- 4-(2-ethylhexyloxy)benzene in 20 ml of anhydrous THF was added dropwise a solution of 2.12 g (18 mmol) of 95% potassium tert-butoxide in 80 ml of anhydrous THF at R.T. with stirring. The reaction mixture was stirred at ambient temperature for 24 h and poured into 500 ml of methanol with stirring. The resulting red precipitate was washed with distilled water and reprecipitated from THF/methanol and dried under vacuum to afford 0.35 g (45% yield). UV ($CHCl_3$) 500. IR (film) 695, 850, 960, 1035, 1200, 1250, 1350, 1410, 1460, 1500, 2840, 2900, 2940, 3040. Anal. Calc. for $C_{17}H_{24}O_2$: C, 78.46; H, 9.23. Found: C, 78.34; H, 9.26.

Molecular weight (GPC vs. polystyrene) $3\times10^5$. Inherent viscosity~5 dl/g (but time dependent due to the tendency to form aggregates). As is the case with a few other stiff chain polymers, the viscosity increases with standing, particularly in benzene. The resulting solution is therefore thixotropic.

The conjugated polymer is highly colored (bright red-orange).

B. Preparation of MEH-PPV via a precursor polymer route.

1. Monomer Synthesis

The monomer synthesis is exactly the same as in the preparation just described.

2. Polymerization of the Precursor Polymer and Conversion to MEH-PPV

A solution of 200 mg (0.39 mmol) of the monomer salt of Preparation 1 in 1.2 ml dry methanol was cooled to 0° C. for 10 min and a cold degassed solution of 28 mg (1.7 equivalents) of sodium hydroxide in 0.7 ml methanol was added slowly. After 10 min the reaction mixture became yellow and viscous. The above mixture was maintained at 0° C. for another 2–3 h and then the solution was neutralized. A very thick, gum-like material was transferred into a Spectrapore membrane (MW cutoff 12,000–14,000) and dialyzed in degassed methanol containing 1% water for 3 days. After drying in vacuo, 70 mg (47%) of "plastic" yellow precursor polymer material was obtained. UV ($CHCl_3$) 365. IR (film) 740, 805, 870, 1045, 1075, 1100, 1125, 1210, 1270, 1420, 1470, 1510, 2930, 2970, 3020. Soluble in $C_6H_5Cl$, $C_6H_3Cl_3$, $CH_2Cl_2$, $CHCl_3$, $Et_2O$, THF. Insoluble in MeOH.

The precursor polymer was converted to the conjugated MEH-PPV by heating to reflux (approx. 214° C.) in 1,2,4-trichlorobenzene solvent. The product was identical with the material obtained in the first preparation.

Example 1

Dual function devices were fabricated by evaporating a metal (Ca) contact on the front of a MEH-PPV film (thickness on the order of 1000 Å) which was deposited from solution onto a glass substrate, said substrate being partially coated with a layer of indium-tin-oxide (ITO). The active area of each device was 0.1 $cm^2$. The MEH-PPV was purchased from UNIAX Corporation. Further details on the synthesis of MEH-PPV can be found in literature (F. Wudl, P. M. Allemand, G. Srdanov, Z. Ni, and D. McBranch, in *Materials for Nonlinear Optics:Chemical Perspectives*, Ed. S. R. Marder, J. E. Sohn and G. D. Stucky (American Chemical Society, Washington, DC, 1991) p. 683–686).

MEH-PPV films were spin-cast from a 0.5% solution in xylene at a spin speed of 2000 rpm. Typical film thicknesses are approximately 1000 Å, corresponding to an optical density of approximately 0.6 at the absorption peak. Devices with polymer film thicknesses from 600 Å to 2000 Å have also been fabricated and tested (thicknesses were varied by applying multiple coatings using spin-casting). The Ca electrode was vacuum evaporated onto the top surface of the MEH-PPV with a thickness of approximately 5000 Å.

Electrical data were obtained with a Keithley 236 Source-Measure Unit. For the photodiode (and photovoltaic) measurements, light was incident from the ITO side. The excitation source was a tungsten-halogen lamp filtered with a bandpass filter (center wavelength of 430 nm, bandwidth of 100 nm) and collimated to form a homogeneous 5 mm×10 mm area of illumination. The maximum optical power at the sample is 20 mW/$cm^2$ as measured by a calibrated power meter. A set of neutral density filters were used for measurements of intensity dependence.

Figure 3:
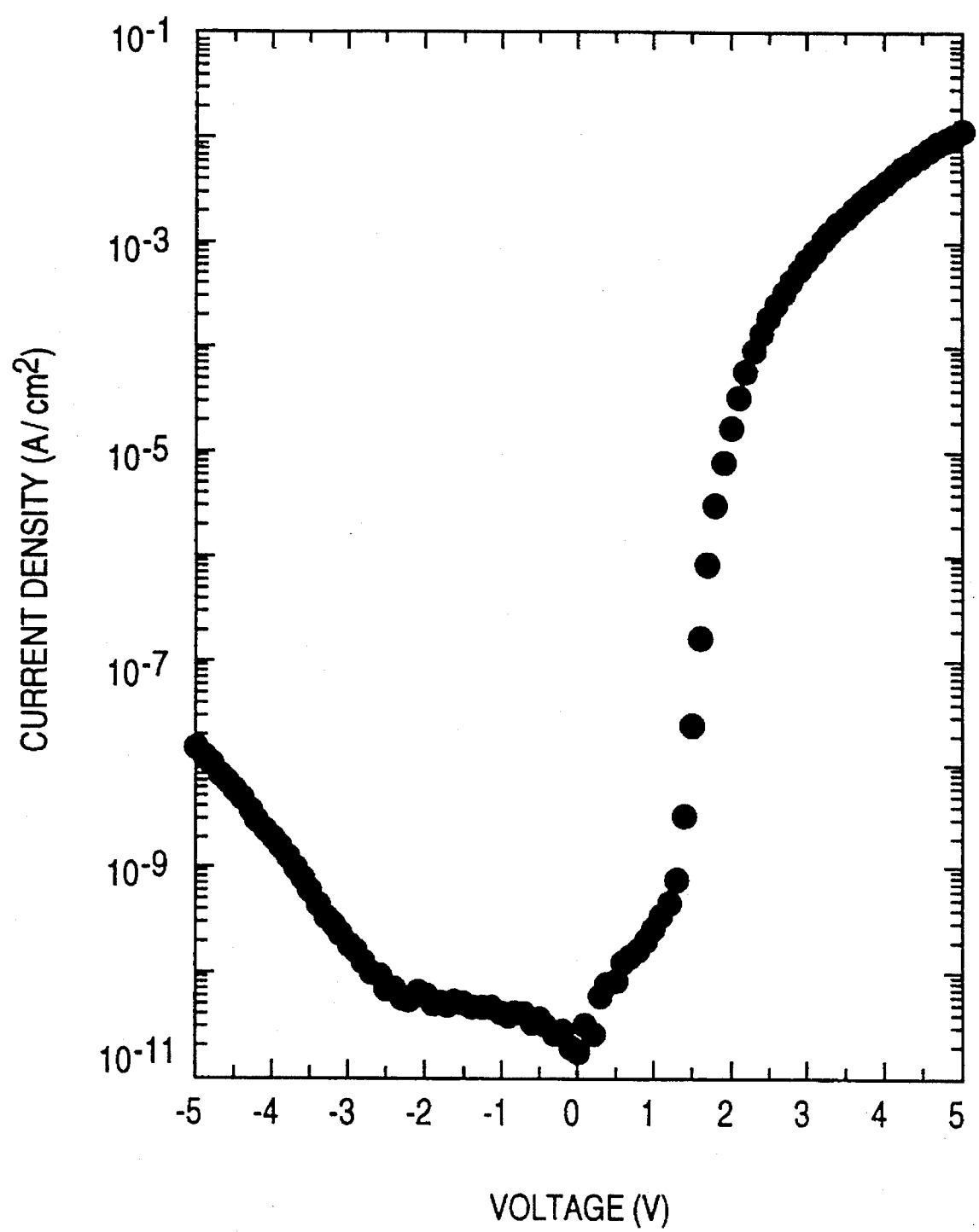
FIG. 3 is a graph of current-voltage characteristics taken from a device of the invention in the dark.
Figure 4:
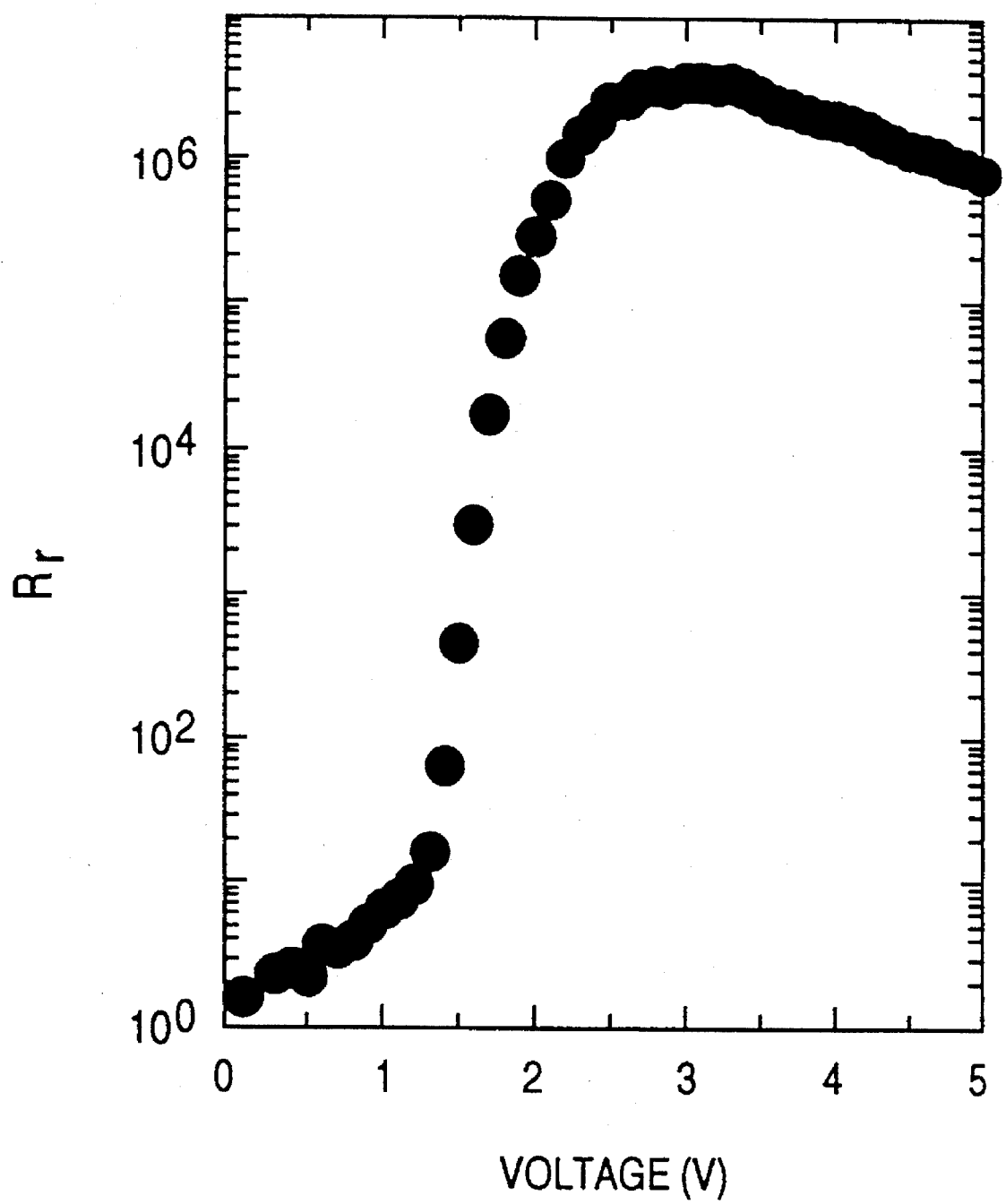
FIG. 4 is a graph showing the rectification ratio ($R_r$) for the same device.

A typical current-voltage (I–V) curve for this device (with thickness ≅800 Å) is plotted in semi-log form in FIG. 3; forward bias is defined as positive voltage applied to the ITO contact. Transport under forward bias can be classified into three regions. A very small current can be detected below 1.3 V; this is dominated by leakage through the device. For good devices, this leakage current is less than $10^{-9}$ A/cm$^2$ at 1 V. In the range 1.3–1.8 V, the current increases exponentially with voltage, by more than four orders of magnitude. Data from devices with different polymer thicknesses show that this turn-on at 1.3 V is independent of the thickness of the polymer layer. The increase of the forward current slows for V>1.8 V, above which the I–V characteristic is that of a tunnel diode with carrier injection into the polymer at each electrode taking place by tunneling (Fowler-Nordheim field emission) (Ian Parker, *J. Applied Phys.* (in press)). The rectification ratio ($R_r$) of this device is plotted in FIG. 4; $R_r>10^6$ in 2–3 V range, comparable to the best polymer diode devices known.

This example demonstrates the ability to fabricate diodes using a semiconducting polymer. Similar device configurations are well known in the literature of conducting polymers and in the literature of polymer light emitting diodes.

Example 2

Figure 5:
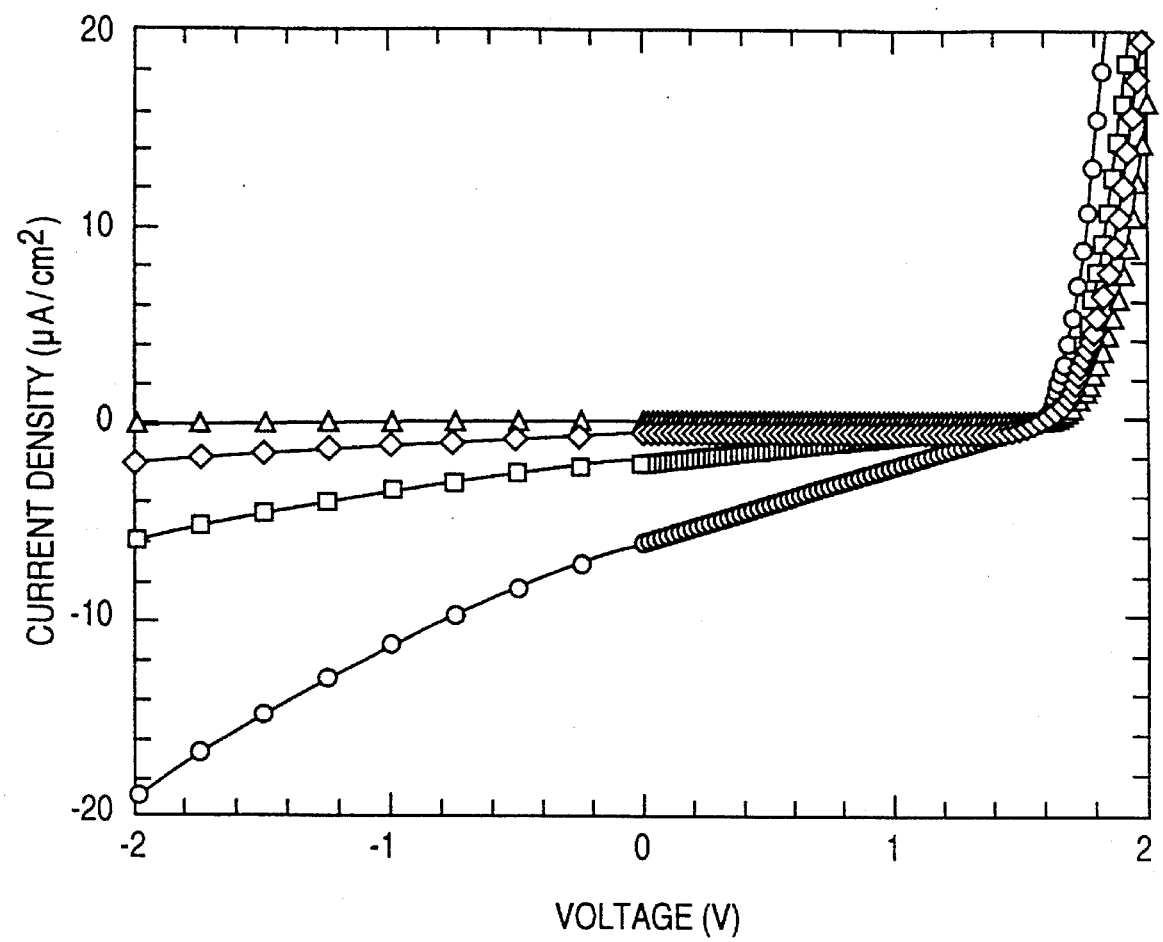
FIG. 5 is a graph of the current-voltage characteristic observed with the device in FIG. 3 in the dark (triangles) and illuminated with 2 mW/cm$^2$ (diamonds), 6.3 mW/cm$^2$ (squares), and 20 mW/cm$^2$ (dots).

Electroluminescence becomes detectable in forward bias for V>2.0 V and visible under room light for currents larger than $10^{-3}$ A/cm$^2$. The emitted light is proportional to the forward current with external quantum efficiency of approximately 1% photons/electron for V>2.5 V, similar to that reported earlier for such Ca/MEH-PPV/ITO devices. In the context of experience with inorganic semiconductors, a photovoltaic effect is also expected for this device. This, in fact, is observed as shown in FIG. 5, where the I–V dependencies are plotted (linear scales) for the device in the dark and under illumination at 2, 6.3 and 20 mW/cm$^2$. At 20 mW/cm$^2$, the open circuit voltage saturates at 1.6 V and the short circuit current is 6.1 μA/cm$^2$. The energy conversion efficiency is about 0.02%, similar to that observed in PPV devices (S. Karg, W. Riess, V. Dyakonov and M. Schwoerer, *Synth. Metals* 54, 427 (1993); H. Antoniadis, B. R. Hsieh M. A. Abkowitz, S. A. Jenekhe and M. Stolka, *Synth. Metals* (in press); R. Friend, Oral presentation at the Minisymposium on Polymer Light Emitting Diodes, Eindhoven, Sep. 15–17, 1993). The corresponding quantum yield at zero bias is $8.8 \times 10^{-4}$ electrons/photon (el/ph).

This example demonstrates that such polymer diodes can be operated as light-emitting diodes. Similar results are well known in the literature of polymer light emitting diodes. This example also demonstrates that the same devices produce a moderate short circuit current and a large open circuit voltage.

Example 3

In reverse bias, the Ca/MEH-PPV/ITO device operates as a photo-diode. The reverse current (with no illumination) remains nearly constant at $\sim 10^{-11}$ A/cm$^2$ for voltages less than 2.5 V. At $V_o \approx -2.5$ V reverse bias, the current begins to increase exponentially. This "turn-on" voltage in reverse bias scales with the thickness of the polymer layer; i.e. the reverse bias current turns-on at field strength of $E_o \approx 2-3 \times 10^5$ V/cm, implying that the current scales as $\exp\{\kappa[|E|-|E_o|]\}$ indicative of tunneling injection.

The photosensitivity increases significantly under reverse bias. As shown in FIG. 5, the photocurrent at −2 V is 19 μA/cm$^2$, five orders of magnitude higher than the dark current at the same voltage.

This example demonstrates that the polymer diode device operates as a photo-diode capable of sensitive and relatively low noise photo-detection of incident light under conditions of reverse bias. This example, when combined with Example 2, demonstrates the dual-function capability of the polymer diode.

Example 4

Figure 6:
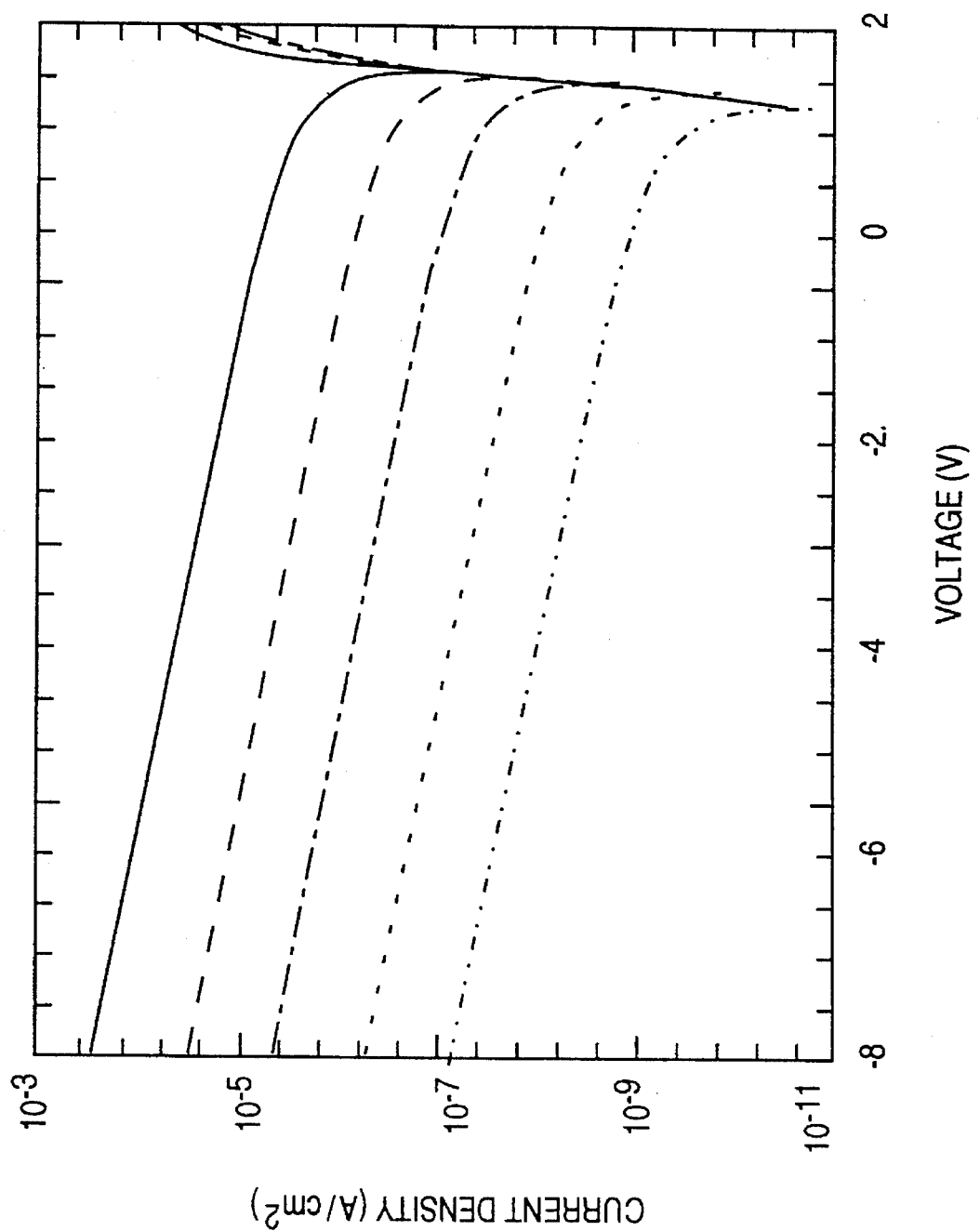
FIG. 6 is a graph of the photocurrent vs. bias voltage for several different incident light intensities applied to a device of this invention. In this graph, the solid curve is 20 mW/cm$^2$; dashed curve, 2 mW/cm$^2$; dot-dashed curve, 0.2 mW/cm$^2$; dotted curve, 20 μW/cm$^2$; and dash-triple dot curve, 2 μW/cm$^2$.
Figure 7:
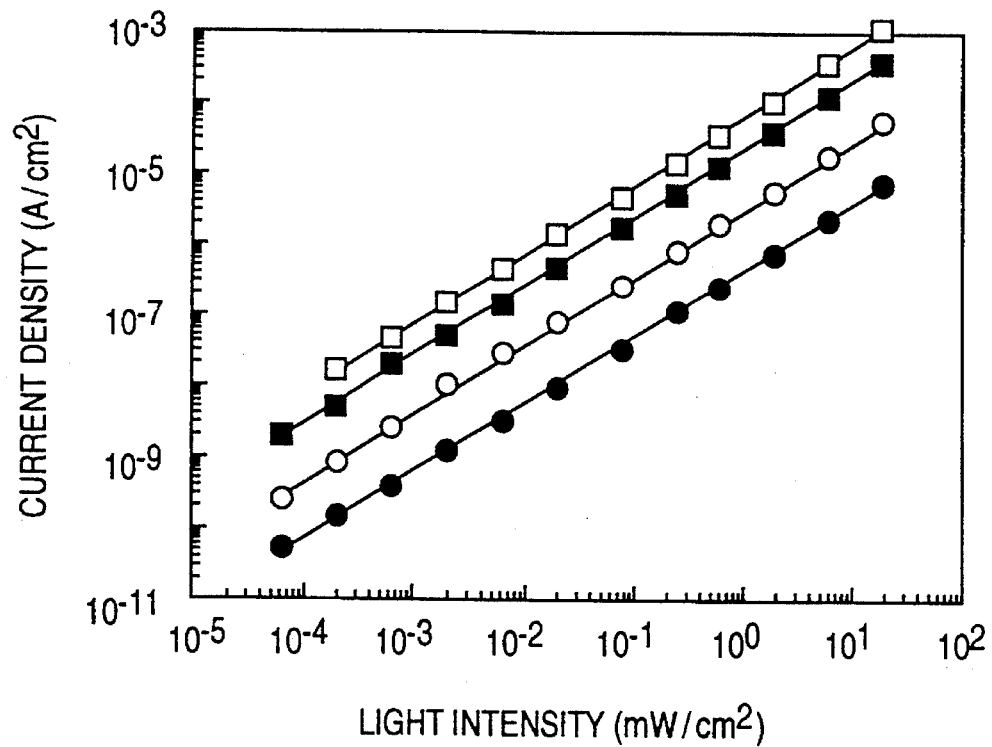
FIG. 7 is a graph of current density vs. incident light intensity for a device of this invention in which circles are short circuit current; open squares, $I_{ph}$ at −4 V; crossed squares $I_{ph}$ at −8 V; diagonal squares, $I_{ph}$ at −10 V.
Figure 8:
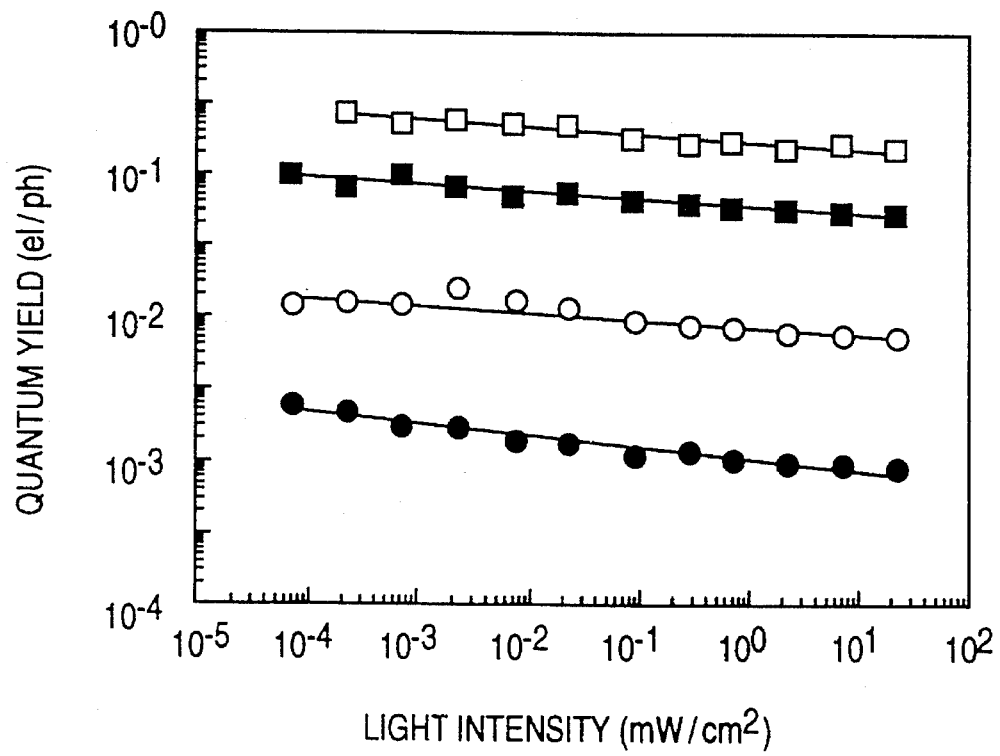
FIG. 8 is a graph of quantum yield vs. incident light intensity for a typical device of this invention in which circles are short circuit current; squares, at −4 V; crossed squares, at −8 V; and diagonal squares, at −10 V.

In FIG. 6, the photocurrent obtained from a Ca/MEH-PPV/ITO diode device operated as a photo-diode is plotted as a function of bias voltage for several light intensities. The photocurrent of the Ca/MEH-PPV/ITO device increases exponentially with the reverse bias. At −8 V, the current density reaches 0.33 mA/cm$^2$ under 20 mW/cm$^2$. The photosensitivity is $1.6 \times 10^{-2}$ A/W, corresponding to a quantum yield of 4.8% ph/el. At −10 V, these numbers increase to 0.045 A/W and 13% ph/el, respectively. The photo-response increases nearly linearly with light intensity ($\cong I^{0.95}$) over the entire range measured, i.e. over more than 5 orders of magnitude. No signature of saturation is observed at 20 mW/cm$^2$ (the highest light intensity in the measurement). This is shown in FIG. 7, in which the short circuit current and the photocurrent under reverse bias (at −4 V and at −8 V) are plotted. The corresponding quantum yields are plotted in FIG. 8. Due to the slight sublinearity of the intensity dependence, the quantum yields are even higher at low light intensities. For example, at −10 V, the quantum yield is >20% (electron/photon) under illumination with 1 μW/cm$^2$.

This example demonstrates that the polymer diode device operates as a photo-diode capable of relatively efficient photo-detection of incident light under conditions of reverse bias. This example, when combined with Example 2, demonstrates the dual-function capability of the polymer diode.

Example 5

Since device lifetime is an important parameter, two types of measurements were carried out at relatively high levels of illumination.(20 mW/cm$^2$). First, more than 20 devices were stored in a N$_2$ dry box and tested several times during a three month period. Each individual set of measurements required less than 10 minutes, so that the total test time was less than 1 hour. The results show that under reverse bias, $I_{ph}$ was relatively stable decreasing to about 60% of the original value over the three month period. The second type of measurement monitored the decay of the photoresponse under continuous light illumination. At −10 V bias, $I_{ph}$ decreases by less than 20% after 15 hours continuous measurement under 20 mW/cm$^2$.

This Example demonstrates promising stability for the Ca/MEH-PPV/ITO dual-function devices.

Example 6

The photo-response was measured for similar devices fabricated with both aluminum and indium as the electron injecting contacts; contact, e.g. Al/MEH-PPV/ITO. For the Al/MEH-PPV/ITO devices, the $V_{oc}$ and $I_{sc}$ under 20 mW/cm$^2$ are 1.05 V and 1.1 μA/cm$^2$, respectively, and the sensitivity and the quantum yield at −10 V are $5 \times 10^{-3}$ A/W and 1.4% el/ph.

This Example demonstrates that dual-function devices can be fabricated from semiconducting polymers using a variety of metal (electron-injecting) contacts.

Example 7

Devices were fabricated using poly(2,5-bis(cholestanoxy)-1,4-phenylene vinylene), again with Ca and ITO as the injecting electrodes for electrons and holes, respectively; i.e. (Ca/BCHA-PPV/ITO). The energy gap in BCHA-PPV increased to 2.2 eV, and the device $V_{oc}$ increased to 1.8 V.

This Example demonstrates that dual-function devices can be fabricated quite generally from different polymers within the known class of polymers useful in polymer light emitting diodes.

What we claim is:

1. A light-responsive diode system comprising
a diode; itself comprising
a conducting first layer having high work function,
a semiconducting second layer in contact with the first layer, the second layer made comprising a luminescent conjugated polymer, and
a conducting third layer in contact with the second layer;
means for applying a reverse bias across the diode;
means for impinging light upon the diode; and
means for detecting an electrical current produced by the diode when the reverse bias is applied to the diode and light is impinged upon the diode.

2. The system of claim 1 wherein the reverse bias is a negative voltage of 1.5 volts or greater.

3. The system of claim 1 wherein the reverse bias is a negative voltage of 2.5 volts or greater.

4. The system of claim 1 wherein the third layer is comprised of a low work function metal.

5. The system of claim 1 wherein the luminescent conjugated polymer comprises a solvent-soluble polymer.

6. The system of claim 5 wherein the luminescent conjugated polymer comprises MEH-PPV.

7. The system of claim 5 wherein the luminescent conjugated polymer comprises BCHA-PPV.

8. The system of claim 1 wherein the luminescent conjugated polymer comprises PPV.

9. The system of claim 1 wherein the first layer comprises an electronegative metal.

10. The system of claim 1 wherein the first layer comprises indium/tin oxide.

11. The system of claim 1 additionally comprising a substrate upon which the diode is carried.

12. The system of claim 11 wherein the substrate is adjacent to the conducting first layer.

13. The system of claim 12 wherein both the substrate and the first layer are transparent and the means for impinging light is means for impinging light through the substrate and first layer.

14. The system of claim 13 wherein the
the first layer is adhered to the substrate and comprises indium/tin oxide,
the second layer comprises MEH-PPV,
the third layer comprises calcium, and
the reverse bias is a voltage greater than −1.5 volts.

15. The system of claim 14 wherein the negative voltage is a voltage greater than −2.5 volts.

16. A light-responsive diode system comprising
a diode; itself comprising
a conducting first layer having high work function,
a semiconducting second layer in contact with the first layer, the second layer made comprising a luminescent conjugated polymer, and
a conducting third layer in contact with the second layer, the third layer comprising an inorganic semiconductor heavily doped with a metallic dopant to a conductive state;
means for applying a reverse bias across the diode;
means for impinging light upon the diode; and
means for detecting an electrical current produced by the diode when the reverse bias is applied to the diode and light is impinged upon the diode.

17. The system of claim 16 wherein the third layer is comprised of a low work function metal and wherein the reverse bias is a negative voltage of 2.5 volts or greater.

18. A dual function light-emitting, light-responsive diode system comprising
a diode; itself comprising
a conducting first layer having high work function,
a semiconducting second layer in contact with the first layer, the second layer made comprising a luminescent conjugated polymer, and
a conducting third layer in contact with the second layer;
means for applying a reverse bias across the diode;
means for impinging light upon the diode;
means for detecting an electrical current produced by the diode when the reverse bias is applied to the diode and light is impinged upon the diode;
means for halting the applying of reverse bias; and
means for applying a positive bias across the diode, said positive bias being adequate to cause the diode to emit light.

19. The system of claim 18 wherein the reverse bias is a negative voltage of 1.5 volts or greater.

20. The system of claim 19 wherein the reverse bias is a negative voltage of 2.5 volts or greater.

21. The system of claim 19 wherein the positive bias is a positive voltage of 1.5 volts or greater.

22. The system of claim 18 wherein the third layer is comprised of a low work function metal.

23. The system of claim 18 wherein the luminescent conjugated polymer comprises a member selected from the group consisting of MEH-PPV, BCHA-PPV, and PPV.

24. The system of claim 18 wherein the first layer comprises an electronegative metal or a conductive metal/metal oxide.

25. The system of claim 18 additionally comprising a substrate upon which the diode is carried, said substrate being adjacent to the conducting first layer.

26. The system of claim 25 wherein both the substrate and the first layer are transparent, the means for impinging light is means for impinging light through the substrate and first layer, and the light which is emitted is emitted through the substrate and first layer.

27. The system of claim 26 wherein the
the first layer is adhered to the substrate and comprises indium/tin oxide,
the second layer comprises MEH-PPV,
the third layer comprises calcium,
the reverse bias is a voltage greater than −1.5 volts, and
the positive voltage is a voltage greater than 1.5 volts.

28. A dual function light-emitting, light-responsive input-output diode system comprising a diode; itself comprising a conducting first layer having high work function, a semiconducting second layer in contact with the first layer, the second layer made comprising a luminescent conjugated polymer, and a conducting third layer in contact with the second layer;

means for applying a reverse bias across the diode;

means for impinging an input signal of light upon the diode;

means for detecting an electrical current produced by the diode when the reverse bias is applied to the diode and the input signal of light is impinged upon the diode;

means for halting the applying of reverse bias; and means for applying a positive bias output signal across the diode, said positive bias output signal being adequate to to cause the diode to emit an output signal of light.

29. A dual function input-output process employing a light-emitting, light-responsive input-output diode system comprising a diode; itself comprising a conducting first layer having high work function, a semiconducting second layer in contact with the first layer, the second layer made comprising a luminescent conjugated polymer, and a conducting third layer in contact with the second layer;

the process involving applying a reverse bias across the diode and impinging an input signal of light upon the diode, detecting as an electrical input signal an electrical current or voltage produced by the diode when the reverse bias is applied to the diode and the input signal of light is impinged upon the diode, halting the applying of the reverse bias, and applying a positive bias output signal across the diode, said positive bias output signal being adequate to to cause the diode to emit an output signal of light in response thereto.

* * * * *